United States Patent [19]

Kimura et al.

[11] Patent Number: 5,443,689
[45] Date of Patent: Aug. 22, 1995

[54] DRY ETCHING PROCESS UTILIZING A RECESSED ELECTRODE

[75] Inventors: Tadashi Kimura; Yoshinobu Nagano, both of Kyoto; Kazuyuki Tomita, Osaka; Tetsu Ikeda, Oita, all of Japan

[73] Assignee: Matsushita Electric Industrial Co., Ltd., Osaka, Japan

[21] Appl. No.: 202,882

[22] Filed: Feb. 28, 1994

Related U.S. Application Data

[63] Continuation of Ser. No. 988,692, Dec. 10, 1992, abandoned.

[30] Foreign Application Priority Data

Dec. 11, 1991 [JP] Japan ................... 3-327180

[51] Int. Cl.$^6$ ............................................. H05H 1/00
[52] U.S. Cl. ..................... 216/63; 156/345; 118/723 E
[58] Field of Search ............... 156/643, 345; 118/723 E, 723 ER, 723 MP, 723 MA, 723 ME, 723 MR, 723 MW, 723 I, 723 IR

[56] References Cited

U.S. PATENT DOCUMENTS 4,793,975  12/1988  Drage ..................... 204/298.15 X
4,897,171   1/1990  Ohmi ..................... 204/298.35 X
4,968,374  11/1990  Tsukada et al. ............. 156/345

FOREIGN PATENT DOCUMENTS 55-55530    4/1980  Japan .
59-181620  10/1984  Japan .
2-155230    6/1990  Japan .
4-29315     1/1992  Japan .

OTHER PUBLICATIONS

Alfred Johnsen et al., "A Physical Phenomenon and its Applications to Telegraphy, Telephony, etc.", IEE Journal, vol. 61, No. 320, pp. 713-715 Jul. 1923.

*Primary Examiner*—R. Bruce Breneman
*Assistant Examiner*—Jonathan D. Baskin
*Attorney, Agent, or Firm*—Wenderoth, Lind & Ponack

[57] ABSTRACT

A dry etching apparatus is provided with parallel electrodes confronting each other, and a high frequency voltage is impressed between the electrodes. The electrode for holding a base material has a recess in its surface and the surface of the electrode is covered with an insulating layer so that part of the structure constituted by the insulating layer and electrode is not in contact with the base material.

3 Claims, 6 Drawing Sheets

DRY ETCHING PROCESS UTILIZING A RECESSED ELECTRODE

This application is a continuation of now abandoned application, Ser. No. 07/988,692, filed Dec. 10, 1992.

BACKGROUND OF THE INVENTION

The present invention relates to a dry etching apparatus for use in the manufacture of semiconductors, thin film devices, etc.

Since such devices as referred to above have been increasingly miniaturized in recent years, severe requirements are demanded for a dry etching apparatus. For example, high dimensional accuracy, high anisotropic properties, high selectivity for a resist, an undercoating film or the like, etc. must be provided. In one device, the temperature of a wafer during etching has been controlled with good accuracy in an attempt to maintain the wafer at a low temperature.

An example of a conventional dry etching apparatus will be described below.

Referring to FIG. 4, there is shown a reaction chamber 1 of a conventional dry etching apparatus which can be kept under a vacuum. A lower electrode 2 for holding a base material 4 is connected to a high frequency power source 7. A thin insulating layer 3 is provided on the upper surface of the lower electrode 2 as in contact with the entire rear surface of the to-be-processed base material 4. An upper electrode 6 is grounded and is provided with a reaction gas entrance (not shown). Reference numeral 5 designates an insulating spacer.

Generally, the lower electrode 2 is made of aluminum and the insulating layer 3 is formed of hard aluminum obtained by anodizing aluminum, having a thickness of 20–80 $\mu$m.

The lower electrode 2 is shown in detail in FIGS. 5A and 5B. Referring to FIGS. 5A and 5B, reference numerals 8 and 9 designate a path along which cooling water flows to cool the base material 4 and a push-up mechanism to push the base material 4 upward so as to transfer the base material 4, respectively. When the push-up mechanism 9 is moved up and down, the base material 4 is lowered onto the lower electrode 2 or is lifted up and then transferred.

The operation of the dry etching apparatus having the above-described structure will now be described.

A reaction gas is introduced in the reaction chamber 1 and the reaction chamber is placed under a desired degree of vacuum. As the high frequency power is supplied from the high frequency power source 7, plasma is generated and the base material 4 is etched. At this time, the base material 4 has a minus potential (approximately $-500$ V–$-1500$ V) corresponding to the decreasing voltage of the cathode because of the plasma. Since the lower electrode 2 is covered with the insulating layer 3, a direct current potential is O V. Therefore, the base material 4 and the lower electrode 2 constitute the electrodes of a capacitor with the insulating layer 3 interposed therebetween, and the impression of the voltage to the capacitor brings about an electrostatic attraction force. As a result of this, the base material 4 is tightly adhered to the insulating layer 3 by the lower electrode 2. Accordingly, a good thermal conduction is achieved, and the temperature of the base material 4 becomes close to that of the lower electrode 2, thus making it possible to process the base material 4 at low temperatures.

In one example, when a 6-inch wafer is processed for one minute with $O_2$ gas, at 150 mTorr pressure, under 300 W of high frequency power at 13.56 MHz, and with a 100 mm distance between electrodes 2 and 6 while the lower electrode 2 is at 20° C., the temperature of the wafer after the electrostatic attraction is 40° C. Without the electrostatic attraction, that is, when the insulating layer 3 is not provided, the wafer is at 120° C.

In the above structure, the minus charges stored in the base material 4 remain even after the power source 7 is turned OFF. Therefore, the electrostatic attraction continues, causing the base material 4 to leap and shift when the push-up mechanism 9 pushes the base material 4 upward as shown by dotted lines I and II in FIG. 5B. The base material 4 is not smoothly handed over to a transfer arm which, in the worst case, results in the base material 4 being broken.

Although the output of the high frequency power source 7 can be lowered before the transfer of the base material 4 so as to decrease the charging potential of the base material 4 or $N_2$ gas can be blown in order to reduce the residual attraction force, it is hard to completely remove the residual attraction force.

SUMMARY OF THE INVENTION

The object of the present invention is, therefore, to provide a dry etching apparatus capable of weakening the residual electrostatic attraction force so as to obviate transfer problems.

In accomplishing this and other objects according to the present invention, there is provided an improved dry etching apparatus provided with flat parallel electrodes confronting each other, wherein a high frequency voltage is impressed between the electrodes, the improvement characterized in that the one electrode which supports a base material has a recess in its surface and the surface of the electrode is covered with an insulating layer, so that part of the structure constituted by the insulating layer and electrode is not in contact with the base material.

BRIEF DESCRIPTION OF THE DRAWINGS

This and other objects and features of the present invention will become clearer from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

A dry etching apparatus according to preferred embodiments of the present invention will be described hereinbelow with reference to FIGS. 1 and 2.

Figure 1A:
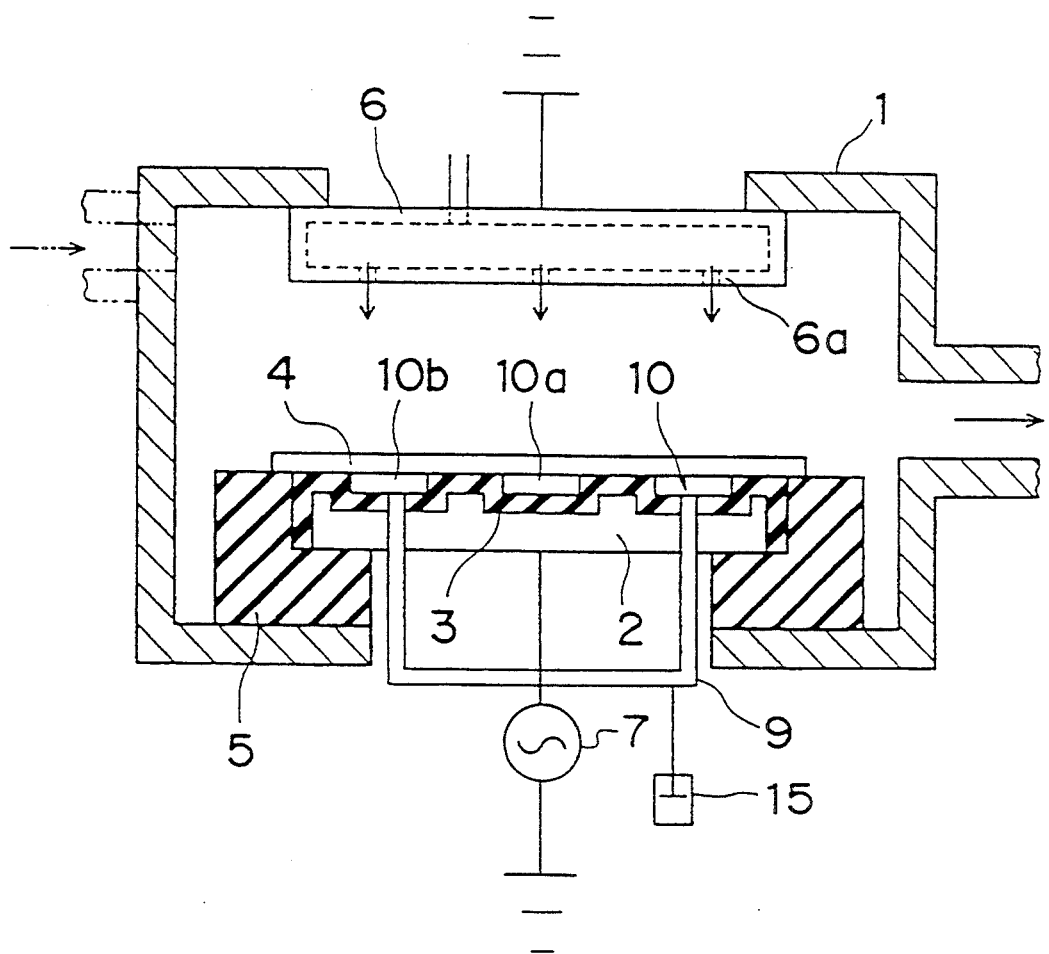
FIG. 1A is a cross-sectional view of one embodiment of a dry etching apparatus of the present invention.

FIG. 1A shows a reaction chamber 1 of one preferred embodiment of a dry etching apparatus of the present invention. The reaction chamber 1 can be maintained under a vacuum. A lower electrode 2 made of aluminum for holding a base material 4, such as a semiconducting substrate made of gallium arsenide, silicone, or glass, is connected to a high frequency power source 7. A high frequency power is supplied from the power source 7 to the lower electrode 2. A thin insulating layer 3 is formed at the upper surface of the lower electrode 2. An insulating spacer 5 upper electrode 6 confronting the lower electrode 2 is grounded and has a reaction gas entrance 6a. Alternatively, a reaction gas entrance is shown by a chain line in FIG. 1.

Figure 1B:
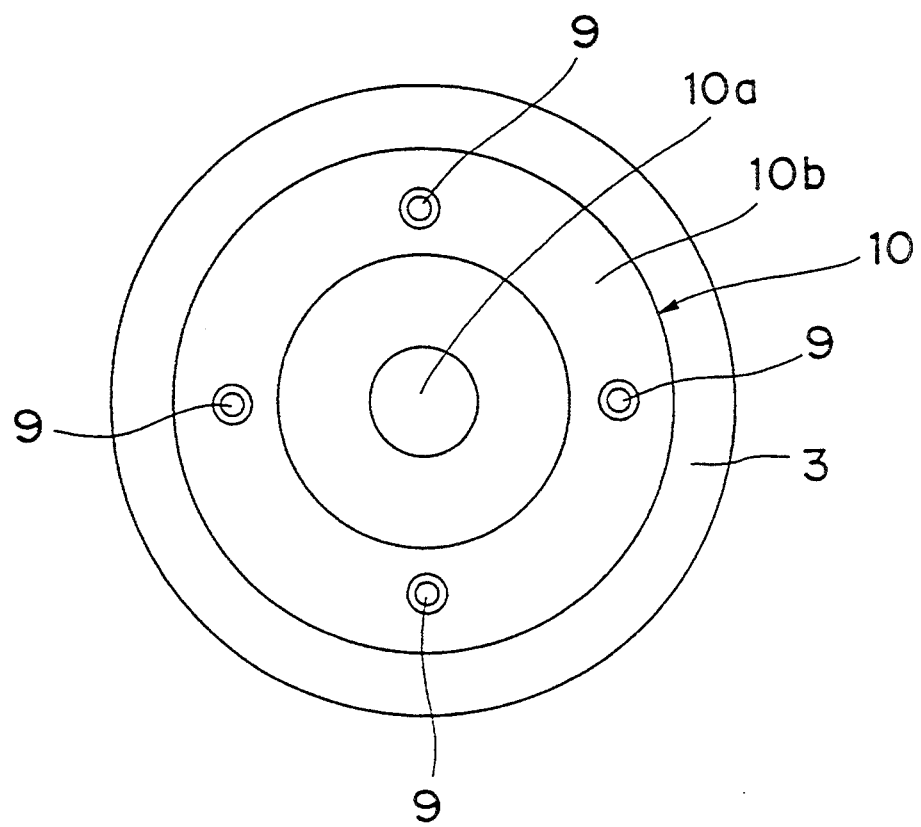
FIG. 1B is a plan view of an electrode of the apparatus shown in FIG. 1.
Figure 2:
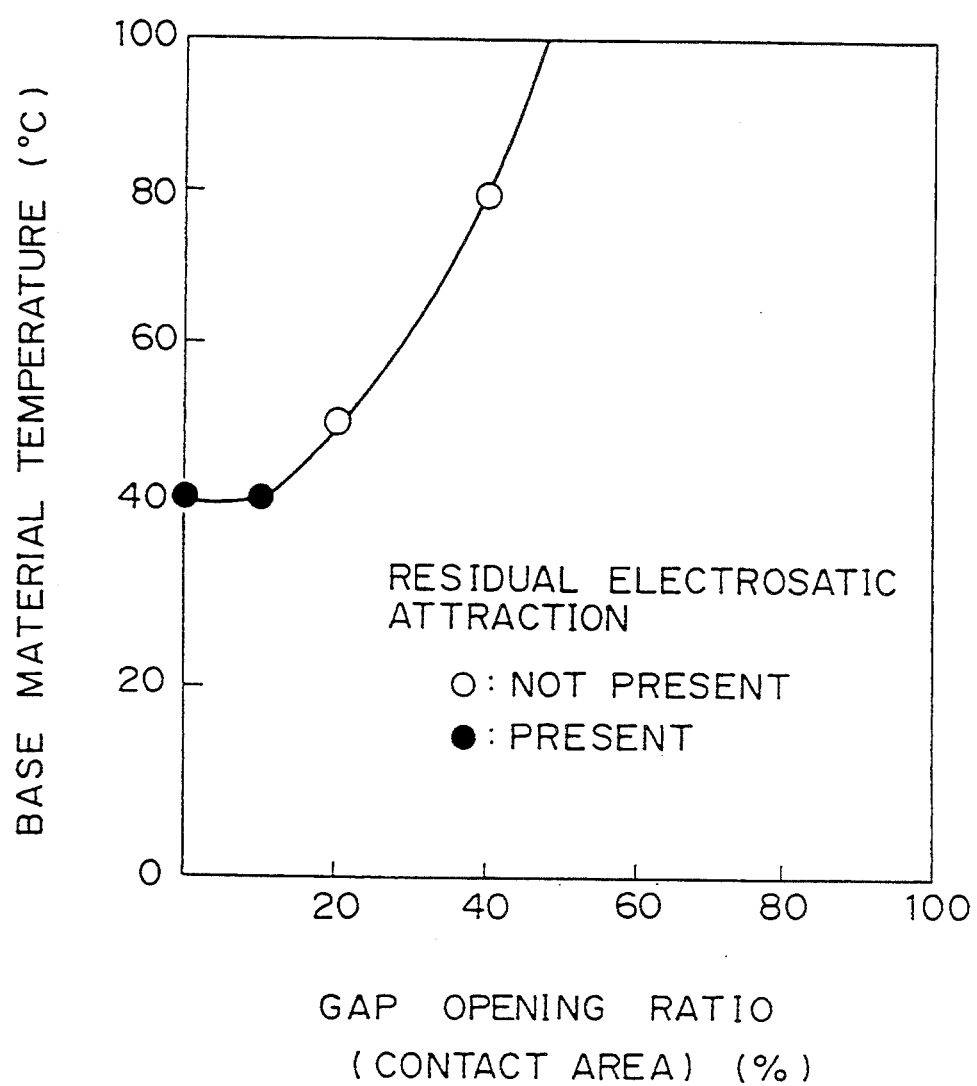
FIG. 2 is a graph of the relationship of the opening ratio of recesses, the temperature of a base material and the residual electrostatic attraction force in the embodiment of the present invention.

The lower electrode 2 has in the upper surface thereof recesses 10 including a circular recess 10a at its center and an annular recess 10b extending around the circular recess 10a as shown in FIGS. 1A and 1B. At the recesses 10, the base material 4 is not close to the upper surface of the lower electrode 2. The 20–80 $\mu$m thick insulating layer 3 which is formed of hard anodized aluminum covers the entire upper surface of the lower electrode 2. Preferably, the thickness of the hard aluminum is not less than 100$\mu$ and the thickness of the aluminum of the electrode is not less than 0.3 mm. Preferably, material having a thermal conductivity that increases when in a vacuum is used for the insulating layer 3.

The operation of the dry etching apparatus having the above-described structure will be discussed below.

Since recesses 10 are formed in the surface of the lower electrode 2, the contact area between the insulating layer 3 and the base material is small. The relationship of the opening ratio of the recesses 10, the temperature of the base material 4 and the residual electrostatic attraction force is shown in a graph of FIG. 2. As is clear from FIG. 2, the residual attraction force is eliminated when the opening ratio is 20%. Although the temperature of the base material 4 is 10° C. higher when the opening ratio is 20% as compared to when there are not recesses, the increased temperature is not practically a problem. If the temperature of the cooling water for cooling the lower electrode 2 is lowered by approximately 10° C., the base material 4 can be at the same temperature as when the opening ratio is 0%.

In the embodiment described hereinabove, the lower electrode 2 has recesses 10 in the upper surface to thereby reduce the area of contact with the base material 4. Therefore, the residual attraction force is decreased, and the problems when the base material 4 is transferred can be solved.

Moreover, because the residual electrostatic attraction force may vary in dependence with kind of the base material 4, the opening ratio of the recesses and the cooling temperature of the electrode may be selected suitably. Preferably, the opening ratio of the recesses 10 is not less than 20% with respect to a semiconducting substrate made of silicon. It is also preferred that the opening ratio of the recesses 10 not be less than 25% with respect to a semiconducting substrate made of glass.

Figure 3:
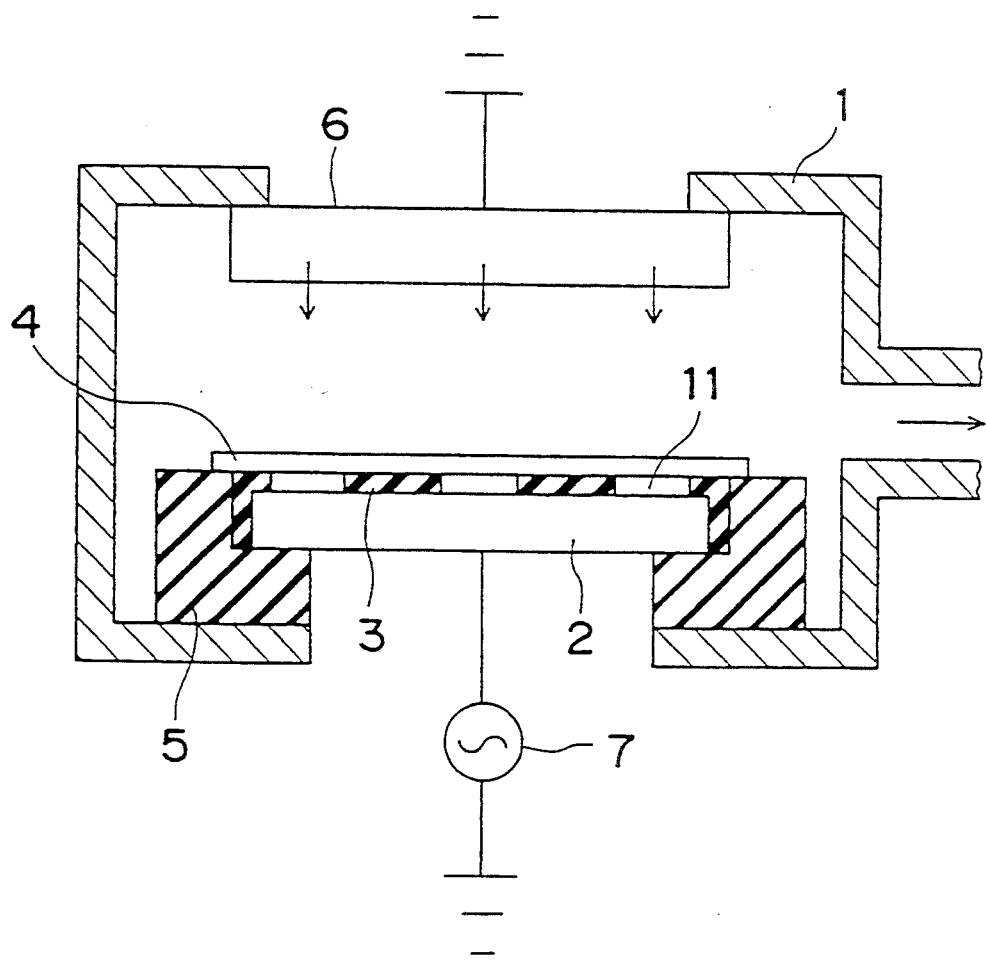
FIG. 3 is a cross-sectional view of another embodiment of a dry etching apparatus of the present invention.
Figure 4:
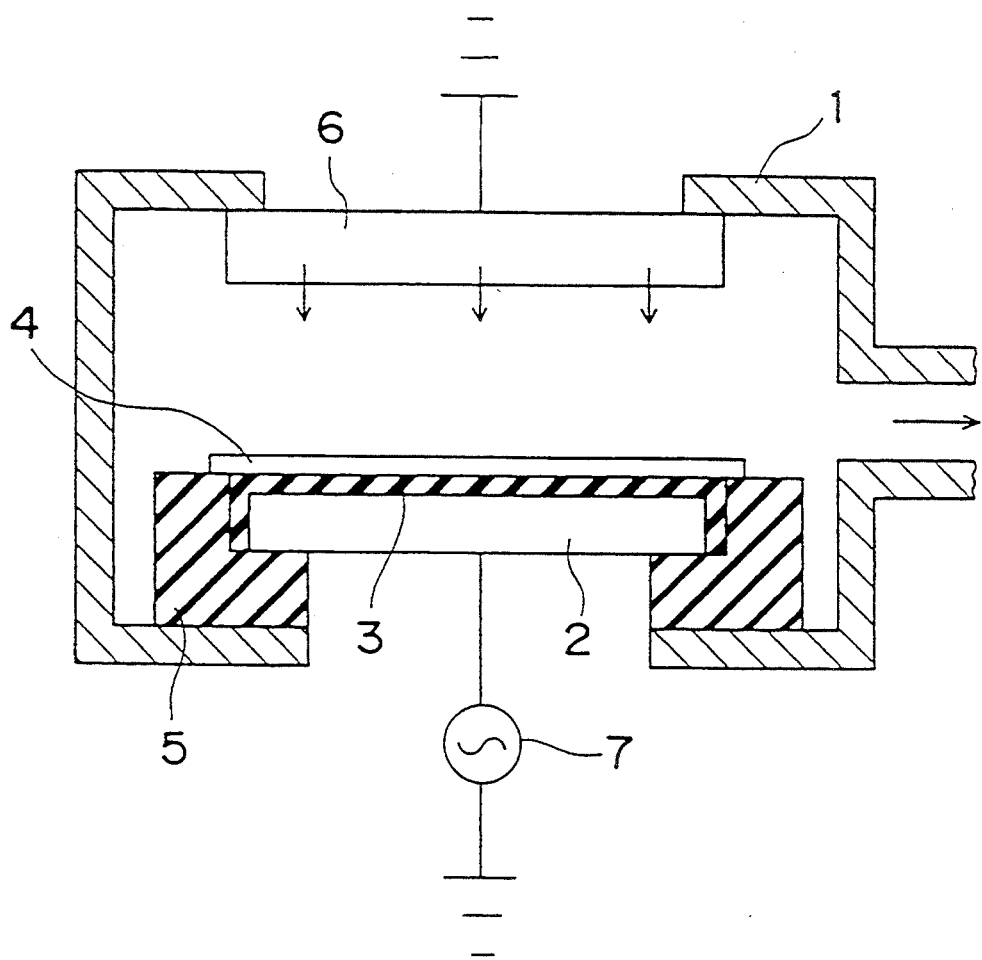
FIG. 4 is a cross-sectional view of a conventional dry etching apparatus.
Figure 5A:
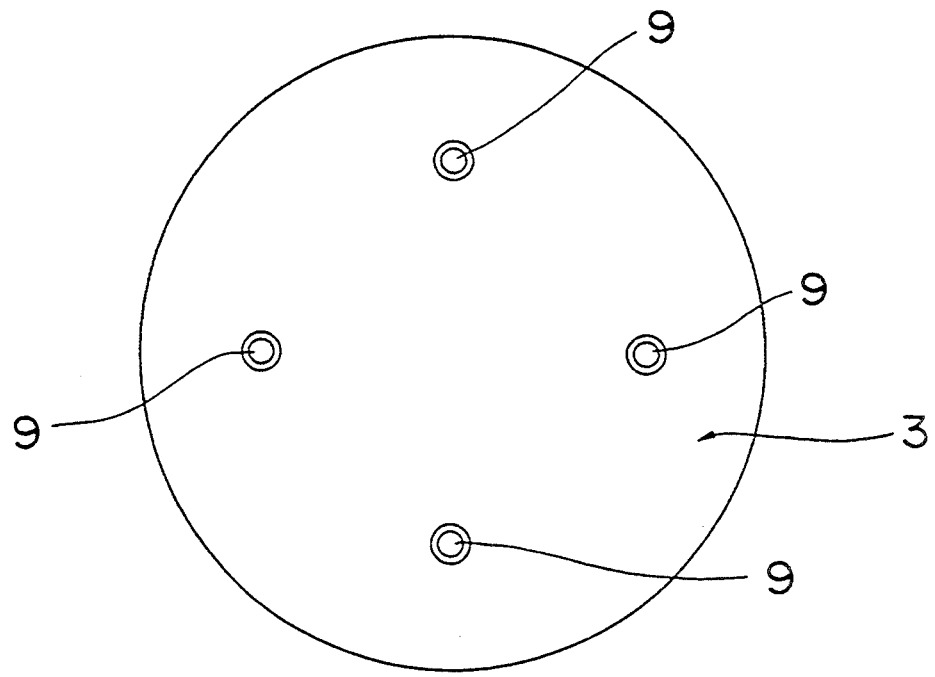
FIGS. 5A and 5B are a plan view and a cross-sectional view of the detailed structure of a lower electrode in the conventional dry etching apparatus.
Figure 5B:
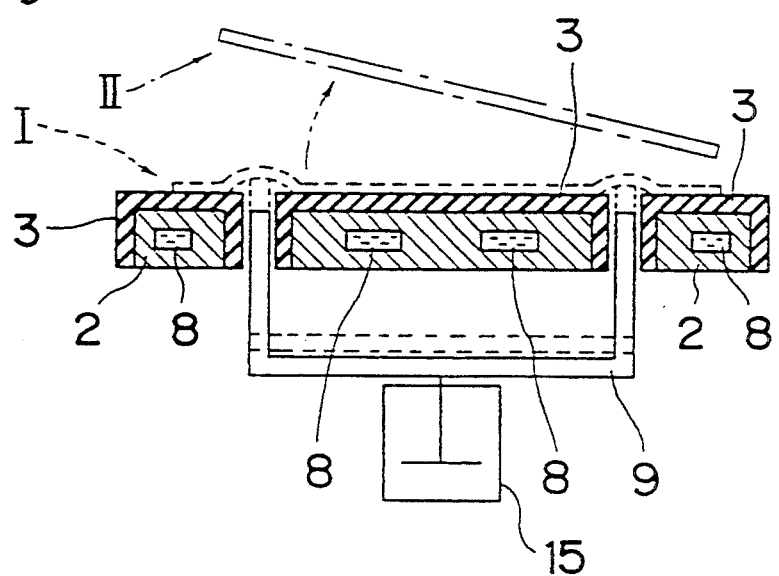

In the foregoing embodiment, the lower electrode 2 has the recesses 10 in the upper surface thereof, and the insulating layer 3 is formed over the entire upper surface of the lower electrode 2. However, it is possible to form the insulating layer 3 on only part of the upper surface of the lower electrode 2 without forming recesses in the electrode 2 itself as illustrated in FIG. 3. That is, the insulating layer 3 may be formed while the upper surface of the lower electrode 2 is masked or the insulating layer 3 may be partially etched and removed after it is formed over the entire surface of the lower electrode 2. In this case, recesses 11 having a similar configuration to the recesses 10 are formed between the base material 4 and the lower electrode 2 where the insulating layer 3 is not present.

The effect achieved in this case is the same as that in the first embodiment.

In the embodiments, the configuration of the recesses 10 and 11 may be changed as desired, e.g. the recesses may extend radially or be in the form of concentric circles.

According to one aspect of the present invention, the electrode for holding a base material has a recess and the surface of the electrode is covered with the insulating layer so that part of the structure does not contact the base material. Alternatively, only part of the surface of the electrode is covered with the insulating layer so that the insulating layer alone contacts the base material. Therefore, the area of contact with the base material is small, thus resulting in a weaker electrostatic attraction force. Since the residual electrostatic attraction force is reduced while the temperature rise of the base material on the electrode is restricted, the base material can be readily transferred.

Although the present invention has been fully described in connection with the preferred embodiments thereof with reference to the accompanying drawings, it is to be noted that various changes and modifications will become apparent to those skilled in the art. Such changes and modifications are to be understood as included within the scope of the present invention as defined by the appended claims unless they otherwise depart therefrom.

What is claimed is:

1. In a dry etching process, the improvement comprising: providing an electrode having at least one recess in a surface thereof that faces toward another electrode disposed parallel thereto, and an insulating layer covering said surface; placing a base material atop said electrode with a rear surface of the base material contacting said insulating layer and covering said at least one recess in its entirety, said rear surface having such an area that the opening ratio of the entirety of the at least one recess over which the rear surface of the base material lies is not less than 20% with respect to said rear surface; and impressing a high frequency voltage between said electrodes.

2. A dry etching process comprising: providing an electrode having at least one recess in a surface thereof that faces toward another electrode disposed parallel thereto and wherein an insulating layer covers said surface; supporting a base material having a rear surface atop said electrode with the rear surface contacting said insulating layer and overlying said at least one recess in its entirety, the rear surface having such an area that the opening ratio of said at least one recess over which the rear surface of the base material lies is not more than 20% with respect to said rear surface; creating a vacuum in a space between said electrodes; and impressing a high frequency voltage between said electrodes.

3. The dry etching process as claimed in claim 2, and further comprising subsequently translating a push-up rod through said one of the electrodes to push the base material upward from the surface of said one of the electrodes.

* * * * *